(12) United States Patent
Hartley (10) Patent No.: US 6,502,952 B1
(45) Date of Patent: Jan. 7, 2003

(54) LIGHT EMITTING DIODE ASSEMBLY FOR FLASHLIGHTS

(76) Inventor: Fred Jack Hartley, 1461 Fair Havens Rd., Fort Myers, FL (US) 33908

( * ) Notice: Subject to any disclaimer, the term of this patent is extended or adjusted under 35 U.S.C. 154(b) by 66 days.

(21) Appl. No.: 09/785,363

(22) Filed: Feb. 16, 2001

Related U.S. Application Data (63) Continuation-in-part of application No. 09/338,625, filed on Jun. 23, 1999, now Pat. No. 6,190,020.

(51) Int. Cl.7 .................................................. F21L 4/02
(52) U.S. Cl. .................... 362/184; 362/205; 362/800
(58) Field of Search ................................. 362/184, 202, 362/205, 800, 206, 208

(56) References Cited

U.S. PATENT DOCUMENTS

| | | | | |
|---|---|---|---|---|
| 5,580,156 A | * | 12/1996 | Suzuki et al. | 362/800 |
| 5,685,632 A | * | 11/1997 | Schaller et al. | 362/202 |
| 5,865,529 A | * | 2/1999 | Yan | 362/800 |
| 5,931,570 A | * | 8/1999 | Yamuro | 362/800 |
| 5,962,971 A | * | 10/1999 | Chen | 362/800 |
| 6,328,456 B1 | * | 12/2001 | Mize | 362/800 |
| 6,404,131 B1 | * | 6/2002 | Kawano et al. | 362/800 |

* cited by examiner

Primary Examiner—Y. My Quach-Lee
Assistant Examiner—Peggy A. Neils (57) ABSTRACT

At least one light emitting diode produces light which is subsequently diffused to broaden an angle of projection for use in collimating reflector type flashlights. A light dispersion location is formed by the light produced following the diffusion of the produced light. This light dispersion location, which may have various diametric configurations, is positioned within a lamp assembly. This placement of the light dispersion location ideally matches the 'light center length', LCL, of conventional incandescent lamps (bulbs) to match the focal point of the collimating reflector of existing collimating reflector type flashlights.

13 Claims, 9 Drawing Sheets

LIGHT EMITTING DIODE ASSEMBLY FOR FLASHLIGHTS

CROSS-REFERENCE

This application is a continuation-in-part of Ser. No. 09/338,625 filed Jun. 23, 1999, U.S. Pat. No. 6,190,020 entitled "Light Producing Assembly for a Flashlight", currently pending. The original application is incorporated herein by this reference.

BACKGROUND

1. Field of the Invention

Generally, the invention relates to light sources for flashlights. More specifically, the invention relates to such light sources wherein at least one light emitting diode produces the light which is subsequently collimated into a beam of light.

2. Description of the Prior Art

It is estimated that in 1998 over two hundred (200) million collimating reflector type flashlights were produced. Conventionally known flashlights which utilize a collimating reflector operate with incandescent lamps (bulbs) which have a filament placed in a geometric position compatible with the focal point of the collimating reflector.

Incandescent lamps (bulbs) are constructed with a 'light center length' or LCL which is defined as the best strait line that can be passed through the majority of the lighted coil. A collimated beam of light, defined by 'beam candle power', is created when the coil is properly positioned to a focal point of the collimating reflector.

As a source of illumination, conventional light emitting diodes are generally limited to small flashlights such as key chain type lights, small pen lights and small flashlights which do not utilized collimating reflectors to enhance the collimation of the produced light. This is due primarily to the narrow view angle of the produced light and the lack of utilization of light bending surfaces or other diffusion methods. Attempts have been made to use light emitting diodes in incandescent lamp bases. These attempts generally have been limited to providing a convenient light source for use in existing flashlights where the produced light does not interact with the collimating reflector of those flashlights. It is important to note that these replacement incandescent lamps using light emitting diodes were not designed to operate with the collimating reflector to produce a beam of light prior to applicants invention.

Conventional, narrow projection angle, light emitting diode light sources lack light bending surfaces to broaden the narrow view angle of the produced light. The light emitting diode, in conventional form, does not make a satisfactory source of light for conventional flashlights because the point source of light is on a plane. The conventional light emitting diode is formed by the deposition of semiconductor materials and phosphors to a substrate in a planar configuration which inhibits use as a broad spectrum light source. Conventional collimating reflector flashlight require the broad spectrum light source.

The Polar light distribution of conventional light emitting diodes is at best one hundred and twenty-five (125) degrees and most commonly fifteen (15) degrees. Conventional collimating reflector flashlights require a polar distribution of three hundred and sixty (360) degrees, (radially), for maximum efficiency.

Some progress has recently been made to provide for a widening of the projection angle of light emitting diodes. A principle method of widening the projection angle of light emitting diodes involves placement of the light emitting diode chip within a tiny cup or bowl reflector base. Work in this area has resulted in widening the projection angle from the common fifteen (15) degrees to as much as one hundred and twenty (120) degrees and slightly beyond. Typically phosphor, or another suitable material, is used as a coating over the light emitting diode chip which then acts to diffuse the light produced by the light emitting diode chip to enable the tiny reflector base to widen the projection angle. These new style light emitting diode chips are ideally suited for use with the present invention.

Both the conventional light emitting diodes and the new style coated light emitting diodes use an acrylic or plastic molded lens package without any indices of refraction or other diffusing methods.

Various methods exist in the art to alter the angle of projection of light. Such conventional methods to alter the angle of projection of light include lighted panels and annunciators, amongst others. Your applicant is unaware of utilization of such methods with light emitting diode light sources wherein the produced light may be efficiently used with flashlights having a conventional collimating reflector.

Light emitting diodes which produce white light, offer a new and superior light source for collimating reflector type flashlights in that they provide superior lamp life and battery run time. Conventional light emitting diode light sources are unsatisfactory for direct use in flashlights with collimating reflectors due to a narrow viewing angle of the light emitting diode, generally between fifteen (15) degrees and thirty (30) degrees. When the conventional light emitting diode is positioned facing away from the collimating reflector, this narrow viewing angle projects the available light beyond the walls of the collimating reflector. When the conventional light emitting diode is positioned facing toward the collimating reflector, this narrow viewing angle projects the available light to only a portion of the wall of the collimating reflector. The curved collimating reflector wall therefore cannot properly act upon the produced light of conventional light emitting diode light sources to collimated the light beam. The new style light emitting diodes which produce wider projection angles suffer similar deficiencies to those experienced by conventional light emitting diodes.

For the above mentioned reasons, mere substitution of a light emitting diode light source for the conventional incandescent lamp in flashlights, where the flashlight has a curved collimating reflector, will fail because the substitute light emitting diode light source and the existing curved collimating reflector will fail to cooperate to produce an acceptable collimated light beam.

Light emitting diodes are superior to conventional incandescent lamps (bulbs) because they: 1) require less power, 2) have a longer life, 3) have a greater resistance to both shock and vibration and 4) provide generally higher color temperature.

Due to the long life of the light emitting diode light source it is conceivable that a flashlight having a light emitting diode as the light source would never require replacement of the light source. Due to the lower power requirement of the light emitting diode light source, batteries of such flashlights would last up to 10 times as long as batteries of conventional incandescent flashlights. This combination provides for considerable cost and environmental savings.

Efforts have been made to provide for a flashlight having a suitably narrow projection beam of light which utilize light emitting diodes as the light source. These efforts avoid use of a collimating reflector and rely upon projection of the light from the light emitting diode directly onto an optical focusing lens which then projects the light passing therethrough into the narrow projection beam of light. Such flashlights, while producing an acceptable beam of light, are extremely expensive to manufacture when compared to collimating reflector type flashlights due to the expense involved with manufacture of the optical focusing lens. For this reason such flashlights are not considered applicable to the present invention.

A great need exists for collimating reflector type flashlights which have low current draw, long life and which are inexpensive to manufacture. Numerous attempts have been made to produce collimating reflector type flashlights which have the desired low current draw, long life and low manufacturing costs. These attempts have been less efficient than desired. The present invention substantially fulfills these needs. Utilization of the designs of the present invention will fill a long felt need and create a new market niche.

SUMMARY

In view of the foregoing disadvantages inherent in the known types of light sources for flashlights, your applicant has devised a method of positioning a light dispersion location of a light emitting diode lamp (bulb) assembly at a relative elevated position generally matching a relative elevated position of a filament of a conventional incandescent lamp when placed in identical flashlights. Various methods may be employed to radially disperse the produced light at the light dispersion location to more closely match the dispersion pattern of the conventional incandescent lamp.

My invention resides not in any one of these features per se, but rather in the particular combinations of them herein disclosed and it is distinguished from the prior art in these particular combinations of these structures for the functions specified.

There has thus been outlined, rather broadly, the more important features of the invention in order that the detailed description thereof that follows may be better understood, and in order that the present contribution to the art may be better appreciated. There are, of course, additional features of the invention that will be described hereinafter and which will form the subject matter of the claims appended hereto. Those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

It is therefore a primary object of the present invention to provide for use of light emitting diodes as practical light sources for conventional collimating reflector type flashlights.

Other objects include;
a) to provide for use of a diffuser unit to spread the light produced by light emitting diodes to a wide angle of projection.
b) to provide for diffuser units having textured surfaces to provide for the wide angle of projection of light produced by light emitting diodes.
c) to provide for diffuser units having multi-faceted surfaces to provide for the wide angle of projection of light produced by light emitting diodes.
d) to provide for placement of a light dispersion location within a lamp assembly which closely matches a light center length, LCL, of a conventional incandescent lamp.
e) to provide for use of multiple light emitting diodes in lamp assemblies.
f) to provide for a combination of a reflector base, a diffuser unit to cover the reflector base and a plurality of light emitting diodes positioned between the reflector base and the diffuser unit to provide for a uniform wide angle distribution of produced light.
g) to provide for color mixing of blue light, green light and red light each produced by a unique light emitting diode chip to produce a visibly acceptable white light.
h) to provide for a lamp assembly having at least one light emitting diode as the light source where the lamp assembly may be installed in a collimating reflector type flashlight as a direct replacement for existing incandescent lamps.
i) to provide for a lamp assembly utilizing a light emitting diode as a light source where the lamp assembly is shaped similarly to existing incandescent lamps.
j) to provide for an extension of a battery power supplies life by utilizing a light emitting diode as the light source for a collimating reflector flashlight compared to the life of the battery power supply when utilizing an incandescent lamp.
k) to provide for an extension of a lamp assemblies life span by utilizing a light emitting diode as the light source for a collimating reflector flashlight compared to the life of an incandescent lamp.
l) to provide for a doping, or coating, of a conventional blue light emitting diode chip utilizing a mixture of red phosphor and green phosphor and blue phosphor to produce a visibly acceptable white light.

These together with other objects of the invention, along with the various features of novelty which characterize the invention, are pointed out with particularity in the claims annexed to and forming a part of this disclosure. For a better understanding of the invention, its operating advantages and the specific objects attained by its uses, reference should be had to the accompanying drawings and descriptive matter in which there is illustrated the preferred embodiments of the invention.

BRIEF DESCRIPTION OF THE DRAWINGS

The invention will be better understood and objects other than those set forth above will become apparent when consideration is given to the following detailed description thereof. Such description makes reference to the annexed drawings wherein;

FIG. 2b is an enlarged sectional side view of a light source assembly as shown in FIG. 2a.

FIG. 15b is a top plan view of the light source shown in FIG. 15a.

FIG. 16 an elevational side view of a lamp assembly having a light source.

FIG. 17b is a plan top view of a segmented reflector as employed within the lamp assembly depicted in FIG. 17a.

FIG. 18 is an elevational side view of a lamp assembly.

FIG. 19 is an elevational side view of a lamp assembly.

FIG. 20b is an elevational side view of the portion of the light source shown in FIG. 20a.

FIG. 21b is a plan top view of the lamp assembly depicted in FIG. 21a.

FIG. 22b is a top plan view of the light emitting diode strip shown in FIG. 22a.

FIG. 23 is an elevational side view of a lamp assembly having the light emitting diode strip show in FIG. 22a through FIG. 22c incorporated therein.

DESCRIPTION

Many different lamp assemblies having features of the present invention are possible. The following description describes the preferred embodiment of select features of those lamp assemblies and various combinations thereof. These features may be deployed in various combinations to arrive at various desired working configurations of lamp assemblies.

Reference is hereafter made to the drawings where like reference numerals refer to like parts throughout the various views.

Anywhere herein where a color (white, blue, green or red for example) is recited to describe light, a light emitting diode, or a light emitting diode chip, the color is referring to the color characteristics of the light or the color characteristics of the light produced by the light emitting diode, or the light emitting diode chip.

The present invention has direct positive environmental impact by significantly reducing the number of batteries consumed by the public. As an example, a conventional tungsten filament lamp for a flashlight draws about seven hundred (700) milliamps while a light emitting diode chip of the present invention draws about twenty (20) milliamps while producing comparable lumens. This substantial power draw difference will result in flashlight batteries lasting substantially longer, which means less batteries required over a period of time, which means less batteries being disposed of in land fill areas.

Flashlights

Lamp (bulb) assemblies having features of the present invention are primarily intended for use in collimating reflector type flashlights. In the alternative, such lamp assemblies may be used in optical focusing type flashlights where the produced light moves directly from the light source, and any intervening diffuser units, to the focusing lens in the absence of interaction with a collimating reflector of the flashlight. In these instances it is a desire to uniformly project the light produced by the lamp assembly to the optical element while minimizing a spacing between the light source and the optical element. Lamp assemblies of the present invention are ideally suited to such uses.

Lamp assemblies having features of the present invention may take the form of a replacement lamp capable of being installed into existing collimating reflector type flashlights or may take the form of a lamp for permanent installation into a collimating reflector type flashlight during manufacture thereof. When the lamp is permanently installed during the manufacturing process it is possible, and desirable, to eliminate the transparent envelope as known on conventional lamps as being redundant and not necessary.

Figure 1:
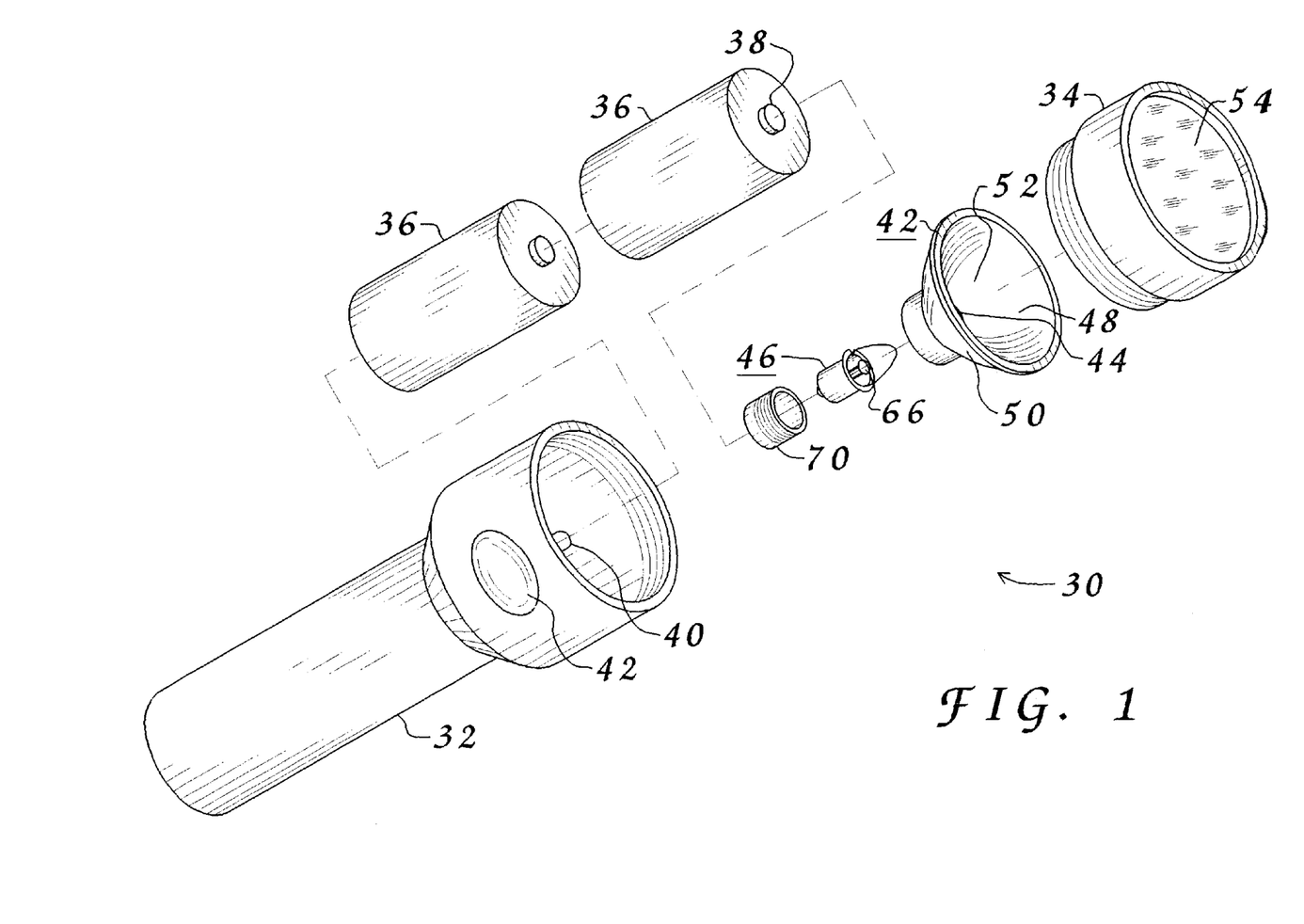
FIG. 1 is an exploded perspective view showing the positional orientation of various components of a flashlight.

Numerous designs of collimating reflector type flashlights exist in the art. Many of these designs may be utilized with the present invention. FIG. 1 depicts one example of such a design wherein a flashlight 30 is shown having a body 32 and a head 34 which are mountable together. Body 32 houses a power supply in the form of batteries 36. Batteries 36 are mounted within body 32 and make contact at a lower extent with an electrical connector as conventionally known in the art, not shown. The outermost battery 36 then has a first power transfer connector 38 positioned thereon. The electrical connector which makes contact with the innermost battery 36 at the base of body 32 then extend upward to a second power transfer connector 40. A switch 42, having an active position, or 'on' setting, and an inactive position, or 'off' setting, provides for user manipulation of a power feed between first power transfer connector 38 and second power transfer connector 40 when other components, more fully disclosed below, provide contact between first power transfer connector 38 and second power transfer connector 40, as conventionally known in the art.

Head 34 accepts positioning therein of a collimating reflector 42. Collimating reflector 42 has a mount 44, (aperture penetrating the lower central location), therein for subsequent installation of a light producing assembly, as exampled in this view by a lamp assembly 46. Collimating reflector 42 has a reflective surface 48 on one side and a conductive surface 50 on the opposing side. Reflective surface 48, which is polished to provide excellent reflective properties, generally defines a reflective cavity 52. Conductive surface 50 is capable of carrying an electrical transfer. A lens cover 54 at the end of head 34 provides for protection of reflective cavity 52 and that portion of lamp assembly 46 positioned therein following assembly of flashlight 30. Lens cover 54 is transparent, as conventionally known in the art.

Figure 2A:
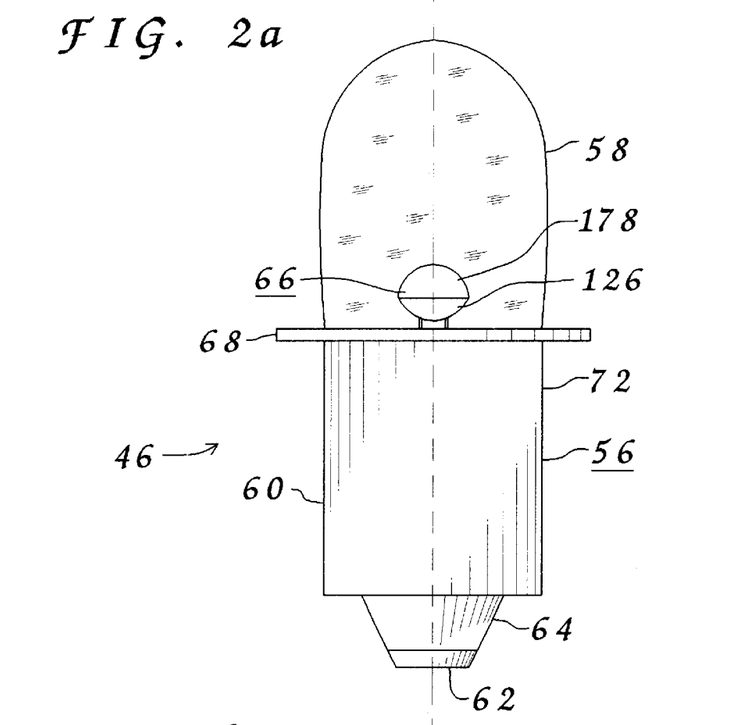
FIG. 2a is an elevational side view of a lamp assembly shown in FIG. 1.

With reference now to FIG. 1 and FIG. 2a, lamp assembly 46, being typical of lamp assemblies of the present invention, has a base 56 and a transparent protective cover 58 extending from one end of base 56. Base 56 has an exterior 60 and an interior, not shown in these view. Preferably, transparent protective cover 58 provides for a sealing of at least a portion of the interior of base 56. Certain configurations of lamp assemblies will not have the transparent protective cap, see FIG. 16 as an example. Exterior 60 is capable of carrying an electrical transfer. A first electrical connector 62 is positioned at the end of base 56 and is surrounded, and insulated from, exterior 60 by an insulator 64. First electrical connector 62 is coupled through base 56 to provide power into the interior of base 56 for subsequent connection to a light source 66.

Numerous designs are known in the art to provide for coupling means for a mounting of the lamp assembly within the flashlight. A flange 68 extends outward radially from base 56 in close proximity to transparent protective cover 58 and outward beyond the limits of transparent protective cover 58. Flange 68 is capable of carrying an electrical transfer and is an extension of exterior 60. Flange 68 allows lamp assembly 46 to be inserted into mount 44 with flange 68 in contact with collimating reflector 42. This arrangement provides for transparent protective cover 58 to extend through to reflective cavity 52 of collimating reflector 42. A coupling member 70 is threaded for attachment to collimating reflector 42 while lamp assembly 46 is positioned within mount 44 to securely hold lamp assembly 46 relative to collimating reflector 42. Therefore, flange 68, in cooperation with exterior 60 of base 56 and conductive surface 50 of collimating reflector 42, forms a second electrical connector 72. Second electrical connector 72 is coupled through base 56 to provide power into the interior of base 56 for subsequent connection to light source 66.

When properly mounted, and when switch 42 is in the active position, first power transfer connector 38 of flashlight 30 may make contact with first electrical connector 62 of lamp assembly 46 to transfer power therebetween. Similarly, second power transfer connector 40 of flashlight 30 may make contact with second electrical connector 72 for conductive communication with exterior 60 of lamp assembly 46 to transfer power therebetween. This arrangement allows power to be active or inactive, depending upon the status of switch 42, to components of lamp assembly 46. Light source 66 has an array of four (4) light emitting diodes 74, see FIG. 2b and FIG. 2c, which selectively receive power from first electrical connector 62 following a subsequent connection and second electrical connector 72 following a subsequent connection.

Figure 6:
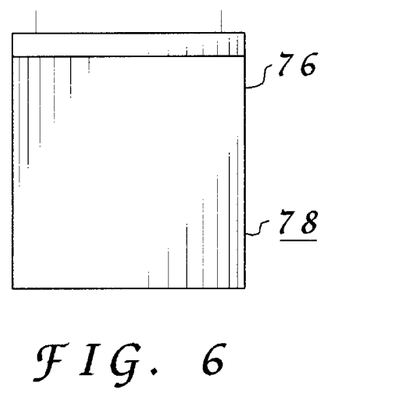
FIG. 6 is a plan view of a representation of a head of a flashlight with a depiction of a desired projection of a beam of light.

FIG. 6 depicts a head 76 of a flashlight 78. Flashlight 78 produces a projection of a beam of light 80 wherein such projection extends outward from head 76 with little dispersion as is desired for such collimating reflector type flashlights.

Light Source

The light source will be an assembly having at least one light emitting diode chip having a light producing surface. The assembly will either utilize a conventional narrow angle of projection light emitting diode or utilize a new style wide angle of projection light emitting diode. The lamp assembly may have a single light emitting diode or may have a plurality of light emitting diodes.

Ideally, the diffused light produced by lamp assemblies having features of the present invention will project light onto the entire reflective surface of the collimating reflector of the flashlight into which it is installed. This desire may be accomplished based upon many unique embodiments of lamp assemblies. Without regard for the number of light emitting diodes deployed, numerous directional orientations of initial projection are possible. When a single light emitting diode is deployed typically an initial path of projection of the produced light will align with an axis of projection of the collimated beam of light produced by the flashlight. This may be either initially outward from the collimating reflector when the lamp assembly is mounted in the flashlight or inward toward the collimating reflector when the lamp assembly is mounted in the flashlight. When a plurality of light emitting diodes are deployed the paths of projection of the produced light from the separate light emitting diodes may be parallel to each other or may have unique directional orientations.

Lamp assembly having features of the present invention will have a light dispersion location subsequent to production of the light. This light dispersion location typically will match a shape and placement of an exterior of a final diffuser unit acting upon the produced light. Preferably, placement of the light dispersion location within the lamp assembly will result in a matching, or near matching, of placement of a light center length, LCL, of a compatible conventional incandescent lamp.

The light emitting diode assembly preferably will have a protective cover over the light emitting diode chip. This protective cover may have diffusion properties if desired even to the extent of being the sole detached diffuser unit. This protective cover, with or without diffusion properties, may cover a single light emitting diode chip or multiple light emitting diode chips.

A greater protective cover may be employed to protect components of the lamp assembly. In one embodiment this greater protective cover will take the form of a transparent envelope generally matching a size and shape of the glass envelope of conventional incandescent lamps. In another embodiment this greater protective cover will take the form of a cover over an assembly having a plurality of light emitting diode chips positioned therein. Any such greater protective cover may be transparent or translucent, may have diffusion properties, may have reflective properties or any combination thereof.

One particularly desirable embodiment involves an assembly having a plurality of light emitting diode chips uniformly radially disposed within a small reflector and having a diffuser unit closing the small reflector. In this embodiment the assembly may be aligned with a central axis passing through the diffuser unit and the small reflector with the diffuser unit either facing toward or away from the collimating reflector when the overall lamp assembly is mounted within a collimating reflector type flashlight. In this embodiment the plurality of light emitting diodes mounted in the small reflector preferably are symmetrically positioned about the central axis with the light producing surfaces facing generally away from the central axis. Even more preferably, the light emitting diodes are each angled downward slightly to point the light producing surfaces more toward the small reflector.

When multiple light emitting diode chips are employed a potential problem involves heat build up which may damage components of the lamp assembly including the light emitting diodes and the fine wires used to provide power to them. Therefore it is desirable to provide for heat sink dissipation of heat when multiple light emitting diodes are used. Preferably such a heat sink dissipation solution includes direct mounting contact to the light emitting diodes where the heat sink may absorb and dissipate the heat. This can easily be accomplished by utilizing a metal which readily absorbs heat such as brass or copper.

Figure 3:
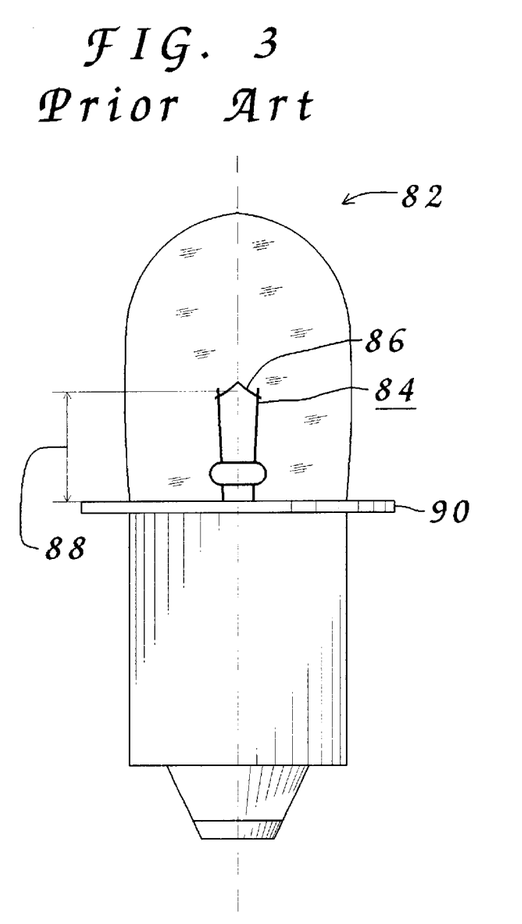
FIG. 3 is an elevational side view of a conventional flashlight lamp and labeled as 'Prior Art'.

Referring now to the state of the art, FIG. 3 depicts an example of a lamp bulb 82, as conventionally known in the art, for use in collimating reflector type flashlights and comparable to the present invention. Lamp bulb 82 has a light source 84 which has a filament 86 which produces light in response to a power flow passing therethrough. Filament 86 has a spacing 88 from a flange 90 which matches a focal point of the collimating reflector when positioned within the collimating reflector type flashlight, not shown in this view. Ideally the light dispersion location of lamp assemblies having features of the present invention will be positioned at a similar position when mounted in such collimating reflector type flashlights.

Figure 4:
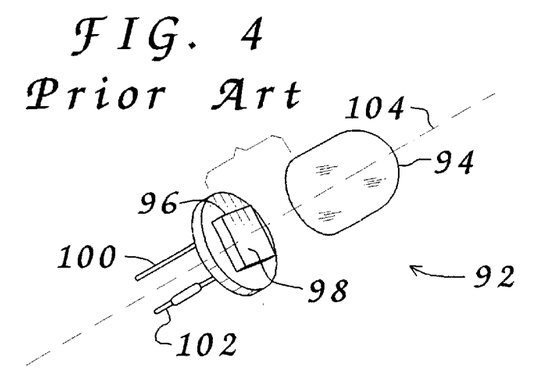
FIG. 4 is a perspective view of a light emitting diode with a protective cover partially removed therefrom and labeled as 'Prior Art'.

Light emitting diodes employed for usage with the present invention may be of many different sizes and shapes. Many conventionally known light emitting diodes may be utilized with the present invention. Any additional components required to enjoy full function of those specific designs, as conventionally known in the art, may be employed as needed. Referring now to FIG. 4, a light emitting diode 92, as conventionally known in the art, is depicted having a protective cover 94 which is transparent, shown removably displaced in this view. Light emitting diode 92 has a light emitting diode chip 96 having a light producing surface 98 positioned thereon which produces a light when power flows through light emitting diode 92 from a first power coupling 100 to a second power coupling 102. Light producing surface 98 has a central axis 104 extending therethrough. The produced light from light emitting diode 92 has the characteristics associated with conventional light emitting diode light production. In the embodiment depicted, the light extends outward from light producing surface 98, in a slightly expanding pattern, generally aligned with central axis 104.

Figure 5:
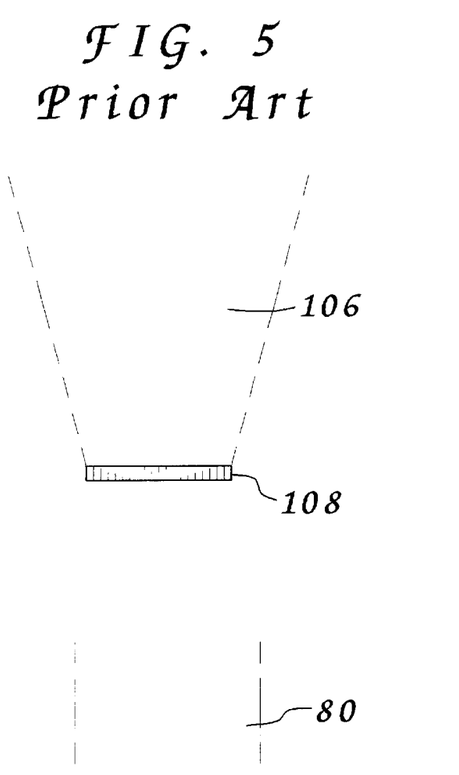
FIG. 5 is an elevational side view of a light emitting diode chip with a depiction of a projection of produced light and labeled as 'Prior Art'.

FIG. 5 depicts a projection of produced light 106 as may be produced by a light emitting diode 108, as conventionally known in the art. In this example produced light expands outward at about thirty (30) degrees.

Figure 7:
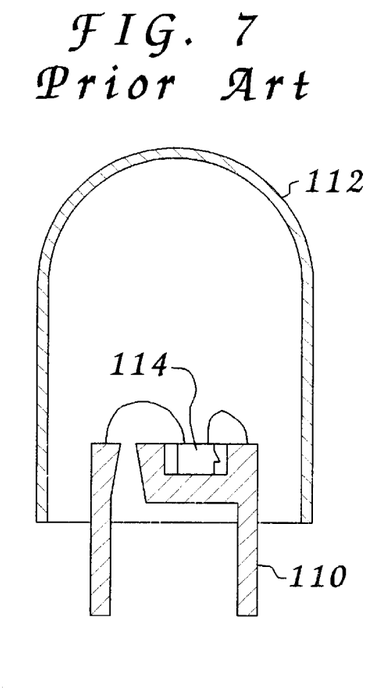
FIG. 7 is a sectional view of a conventional light emitting diode and labeled as 'Prior Art'.

FIG. 7 depicts a light emitting diode assembly 110, as conventionally known in the art, having a protective cover 112 positioned thereover, also as conventionally known in the art. Light emitting diode assembly 110 has a light emitting diode chip 114 which produces light when power passes therethrough. Such common types of light emitting diode assemblies as 110 typically produce light at a fairly narrow angle of projection. Light emitting diode chip 114 is capable of being manufactured to produce various colors of light as exampled by blue, red and green.

Figure 8:
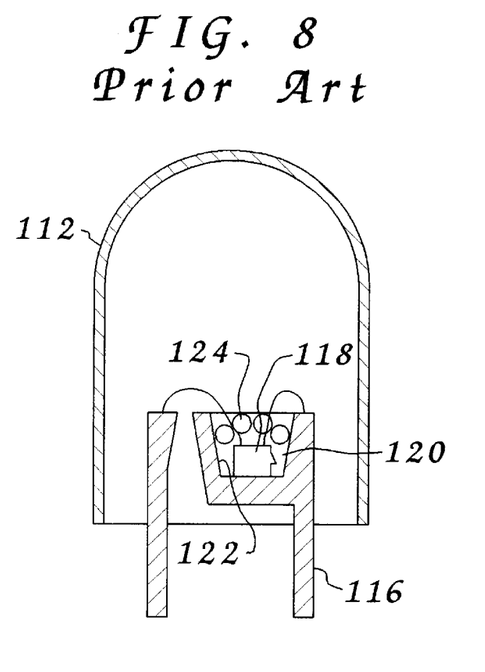
FIG. 8 is a sectional view of a modern wide angle light emitting diode and labeled as 'Prior Art'.

FIG. 8 depicts a light emitting diode assembly 116, as conventionally known in the art, having protective cover 112 positioned thereover. Light emitting diode assembly 116 has a blue light emitting diode chip 118 positioned to set down into a cup 120. Cup 120 has a radially disposed reflective wall 122. A phosphor 124, yellow in this case, covers blue light emitting diode chip 118 within cup 120. When blue light emitting diode chip 118 produces blue light it passes through the yellow phosphor 124 and the characteristics of the light produced change to appear white while also interacting, to some extent, with reflective wall 122. This interaction broadens the angle of projection of the produced light, all as conventionally known in the art.

Figure 2B:
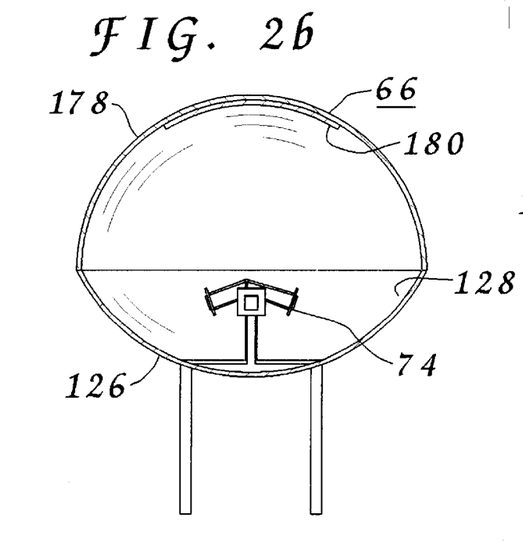
Figure 2C:
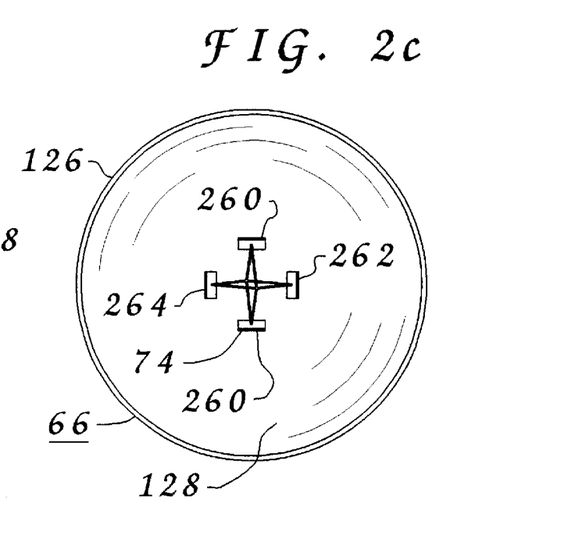
FIG. 2c is an overhead plan view of a portion of the light source assembly as shown in FIG. 2b with the diffuser unit removed.

Referring now to the present invention, FIG. 2b and FIG. 2c depict light source 66 having four (4) light emitting diodes 74. Light source 66 is mounted within a reflector base 126 to project produced light to a reflective surface 128 of reflector base 126. Light source 66 is shown positioned within lamp assembly 46 in FIG. 1 and FIG. 2a.

Figure 12:
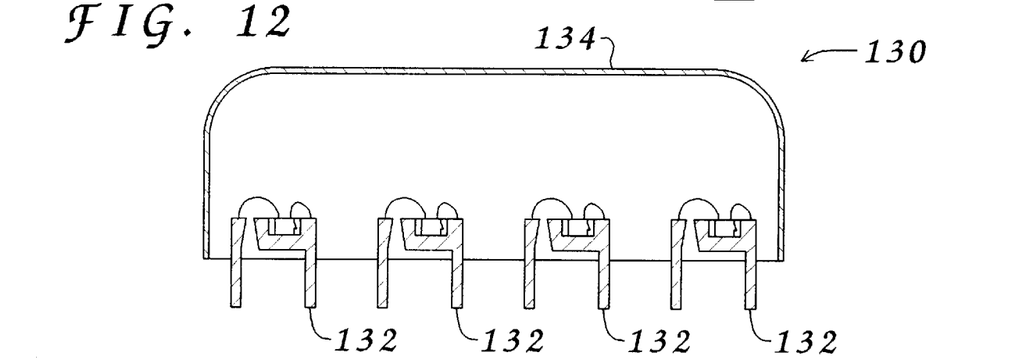
FIG. 12 is a sectional view of a light emitting diode array having an elongated protective cover positioned thereover.

FIG. 12 depicts a light source 130 having four (4) light emitting diodes 132 linearly aligned and facing in a common direction. An elongated protective cover 134 protects light emitting diodes.

Figure 15A:
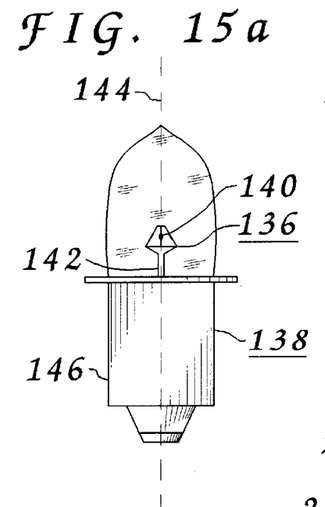
FIG. 15a is an elevational side view of a lamp assembly having a light source.
Figures 15B, 16, 17B, 18, 19:
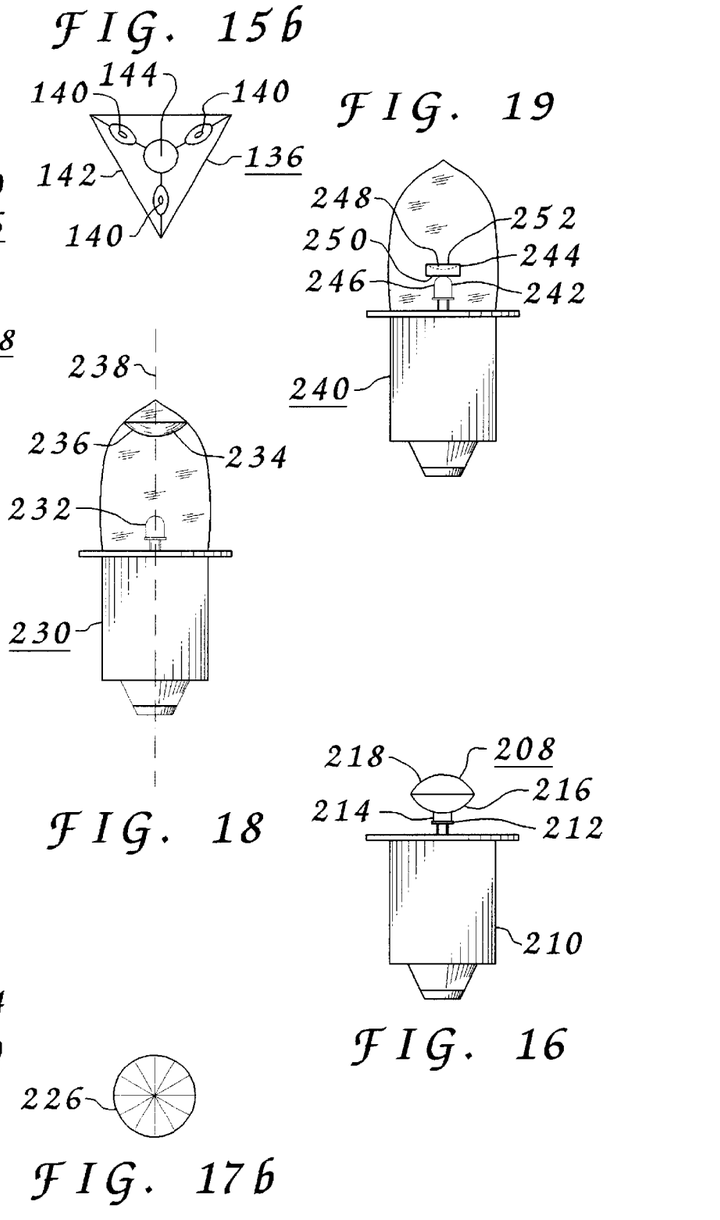

FIG. 15a and FIG. 15b depict a light source 136 positioned within a lamp assembly 138 in FIG. 15a and having three (3) light emitting diodes 140 positioned about a mount 142. Mount 142 has heat dispersion properties to remove excess heat from light source 136 during usage. Light emitting diodes 140 are symmetrically positioned about mount 142 wherein each face away from a central axis 144. Light emitting diodes 140 are each angled upward slightly from a base 146 of lamp assembly 138.

Figure 20A:
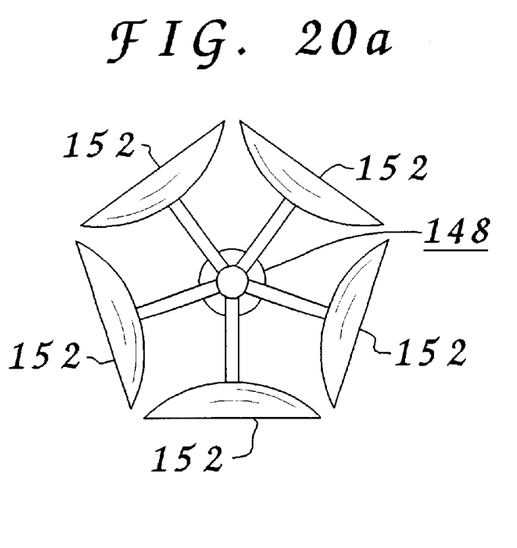
FIG. 20a is a top plan view of a portion of a light source.
Figure 20B:
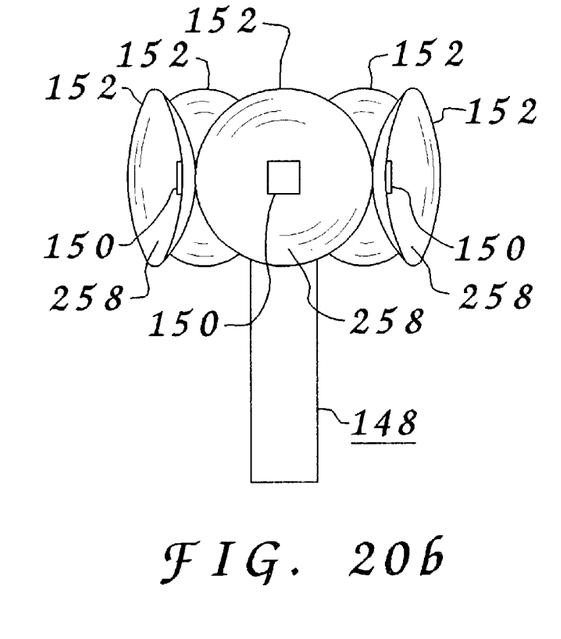

FIG. 20a and FIG. 20b depict a light source 148 having five (5) light emitting diodes 150, only three (3) shown, each mounted within a reflector base 152.

Figure 21A:
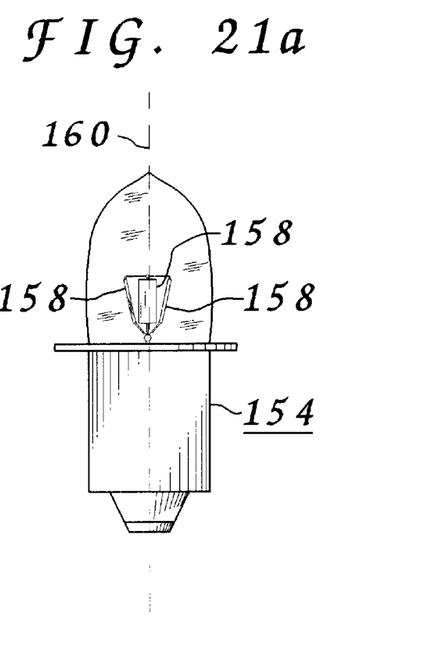
FIG. 21a is an elevational side view of a lamp assembly.
Figure 21B:
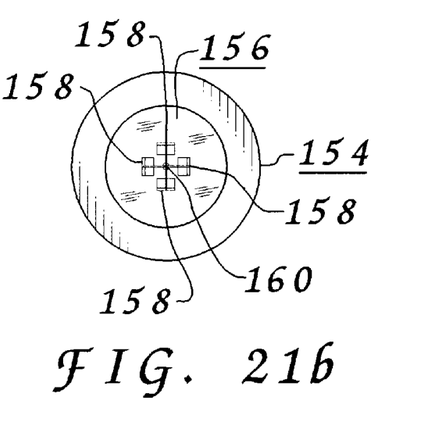

FIG. 21a and FIG. 21b depict a lamp assembly 154 having a symmetrical pattern 156 of four (4) light emitting diodes 158. In this configuration each light emitting diode 158 is angularly offset from a central axis 160.

Figure 24A:
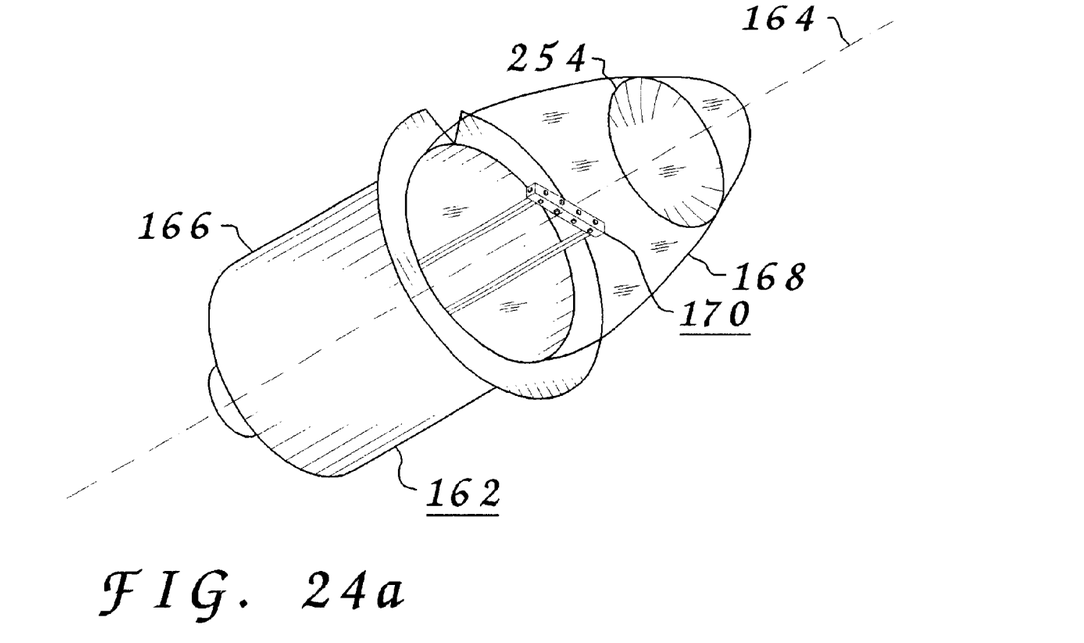
FIG. 24a and FIG. 24b are opposing perspective views of a lamp assembly.
Figure 24B:
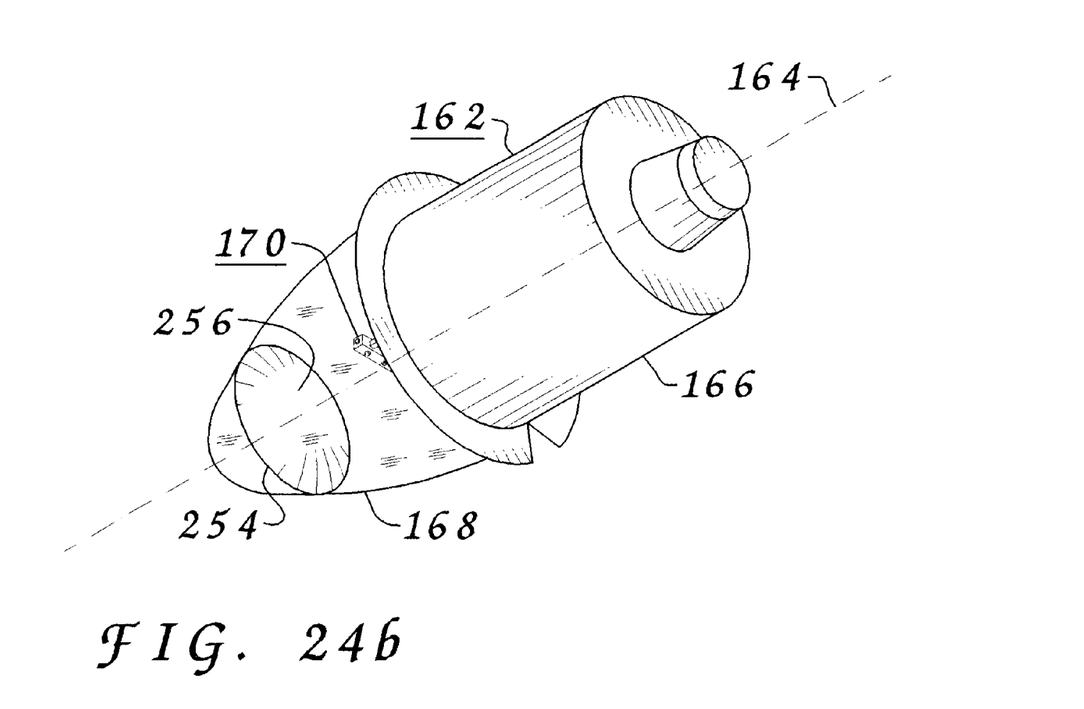

FIG. 24a and FIG. 24b depict a lamp assembly 162 as having a central axis 164 running therethrough aligned generally through a base 166 and a transparent protective cover 168. Various designs are possible which provide for non-symmetrical configuration of the lamp assembly. In such an instance, the central axis will be aligned generally with that portion of the base which penetrates the mount of the flashlight.

Figure 22A:
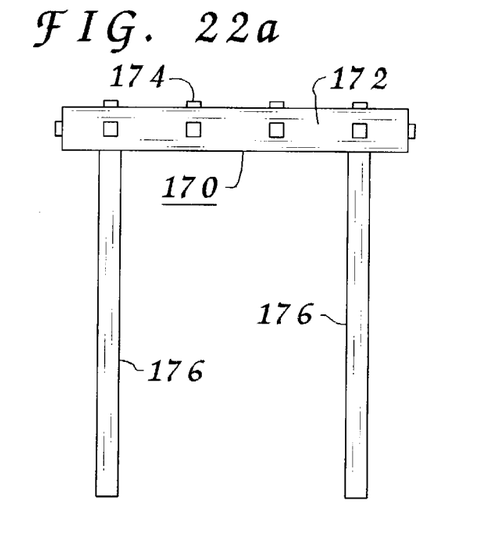
FIG. 22a is a side elevational view of a light emitting diode strip.
Figures 22B, 23:
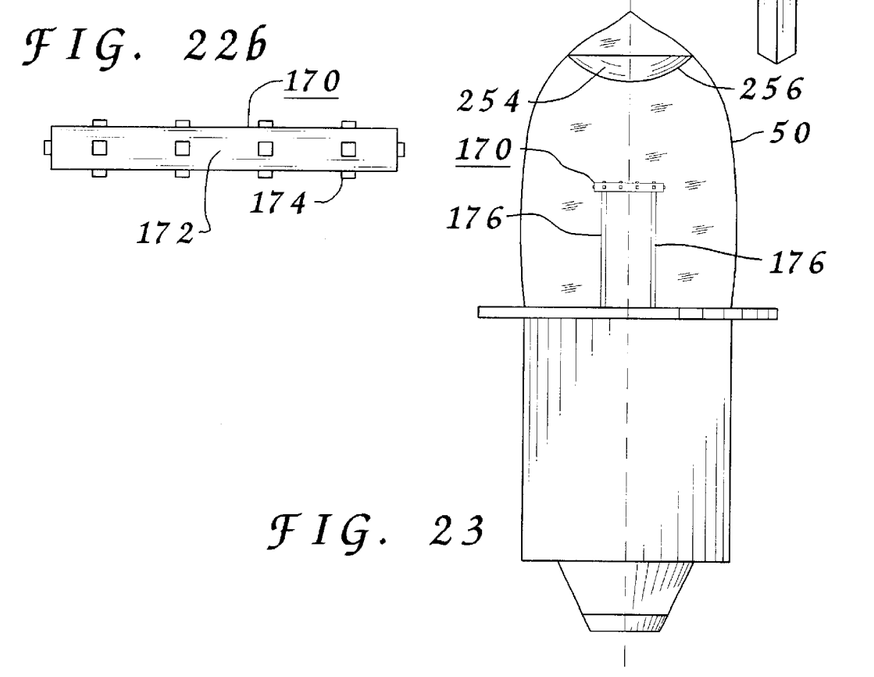
Figure 22C:
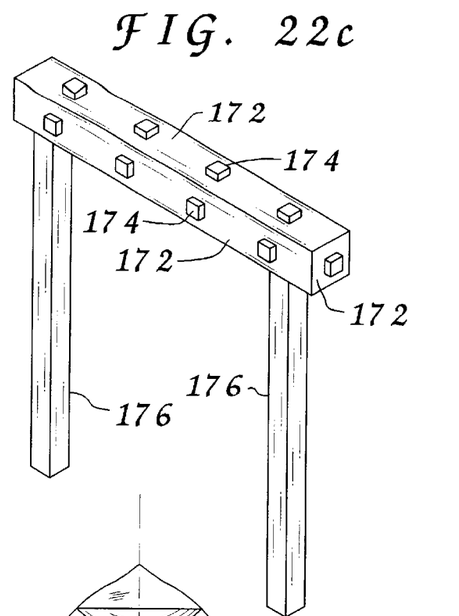
FIG. 22c is a perspective view of the light emitting diode strip shown in FIG. 22a and FIG. 22b.

FIG. 22a, FIG. 22b, FIG. 22c, FIG. 23, FIG. 24a and FIG. 24b depict a light emitting diode strip 170 having six (6) surface areas 172, some hidden in these views, with five (5) surface areas 172 having at least one (1) light emitting diode 174 positioned thereon, (fourteen (14) light emitting diodes 174 are thus depicted as being deployed in this example). Light emitting diode strip 170 is depicted in FIG. 23, FIG. 24a and FIG. 24b positioned within, and being a part of, lamp assembly 162. Light emitting diode strip 170 further has a pair of support posts 176 which provide for placement of light emitting diode strip 170 within lamp assembly 162 and which further provide for power transfer therealong from base 166 of lamp assembly 162. Light emitting diode strip 170 is intended to imitate a conventionally known filament having a linear alignment. Each light emitting diode 174, or lamp assembly 162 generally, may further have additional diffusion feature(s), as elsewhere disclosed herein, incorporated therein to further disperse light produced by light emitting diode strip 170. Such clusters, as exampled by light emitting diode strip 170, may therefore act as an 'area' source of light as used by parabolic, or other type, reflectors which collimate produced light into a collimated beam of light in a flashlight.

Diffuser Unit

A diffuser unit will act to expand an angle of projection of light produced by the light source beyond the initial angle of projection of the light source. A single diffuser unit may be deployed or a plurality of diffuser units may be deployed. The diffuser unit may be incorporated into the protective cover which covers and protects the light emitting diode chip or attached thereto. Alternatively, the diffuser unit may be spaced from the light emitting diode chip or chips and any protective cover thereon.

The diffuser unit may be a transparent or translucent unit through which the light passes or may be a reflective unit which reflects the light. In either case a surface texturing may be employed to provide for the desired diffusion of the light. Similarly, a surface faceting may be employed to provide for the desired diffusion of the light. When it is desired to alter the color appearance of the light from the color of the light initially produced coloring may be employed as part of the diffuser unit. When multiple diffuser units are employed different types of diffuser units may be employed.

The diffuser unit may act as the sole structural element to alter the state of the light subsequent to production by the light emitting diode chip and prior to reflection by the collimating reflector of the collimating reflector type flashlight. Alternatively, another structural element or elements may act to alter the state of the light subsequent to the production and prior to the reflection by the collimating reflector. Examples of such other structural elements include reflectors, other diffuser units and optical elements.

The manufacturing fabrication technology of light emitting diodes now has the capability of molding lens covers with textured surface modifications and/or structural elements incorporated therein. Such modifications include conventional texturing, faceting or a combination thereof. The produced light of light emitting diodes having lens covers with such modifications is diffused by the textured surface and the characteristics of the light are changed to project the light at a greater angle. Subsequent to this diffusion the produced light of light emitting diodes having the modified lens covers become a useable lumen source for flashlights having collimating reflectors.

A molded lens cover, preferably of plastic or glass, with molded in diffusion properties, such as indices of refraction or surface texturing, effectively broaden the angle of light dispersion so that it reaches the walls of the collimating reflector of the flashlight. Such molded lens covers having diffusion properties also acts to mix more thoroughly the spectral colors produced by conventional white light emitting diode chips to significantly reduce blue tint bleed through and produce a truer white light. Therefore, by providing diffusion properties to the molded lens covers of conventional white light emitting diode chips we are able to both disperse the light to a greater angle of projection and produce a truer white light having few, if any, visible blue characteristics throughout the projection area.

On any embodiment of the diffuser unit it is possible to provide for a combination of surface texturing, indices of refraction, selective reflective coatings, light baffles or any combination thereof. The surface texturing, the indices of refraction, the reflective coatings and the light baffles may be positioned on, or beneath, light receiving surfaces where the light initial enters the diffuser unit or on, or beneath, light dispersing surfaces where the light exits the diffuser unit. The reflective coatings may be arranged to further diffuse the light reflecting therefrom by lengthening the path of the light within the diffuser unit and also be employed to ensure that the light which enters the diffuser unit only exit from desired locations on the diffuser unit.

FIG. 2a and FIG. 2b depict a diffuser unit 178 positioned relative to reflector base 126 to effectively close reflector base 126 wherein escaping light must pass through diffuser unit 178 which is translucent and has diffusion properties incorporated therein. When light emitting diodes 74 produces light it is initially reflected by reflector base 126. A secondary reflector 180, attached to the interior of diffuser unit 178, prevents escape of light from light source 66 except through desired portions of diffuser unit 178.

Figure 9:
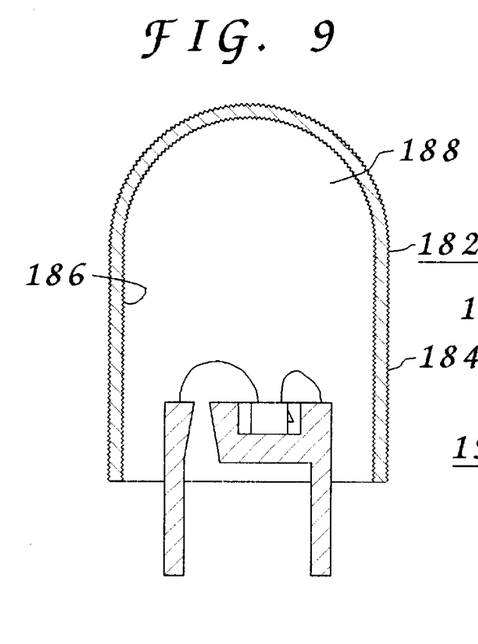
FIG. 9 is a sectional view of one embodiment of surface texturing on a protective cover.

FIG. 9 depicts a protective cover 182 which is transparent and which has an exterior surface texturing 184 and an interior surface texturing 186 which each act to diffuse and scatter light passing through protective cover 182. Only the sectional edges of protective cover 182 are depicted with interior surface texturing 186 but in practice such interior surface texturing 186 would extend throughout an interior 188 of protective cover 182 (not shown). Such texturing (interior or exterior) can take many forms and patterns.

Figure 10:
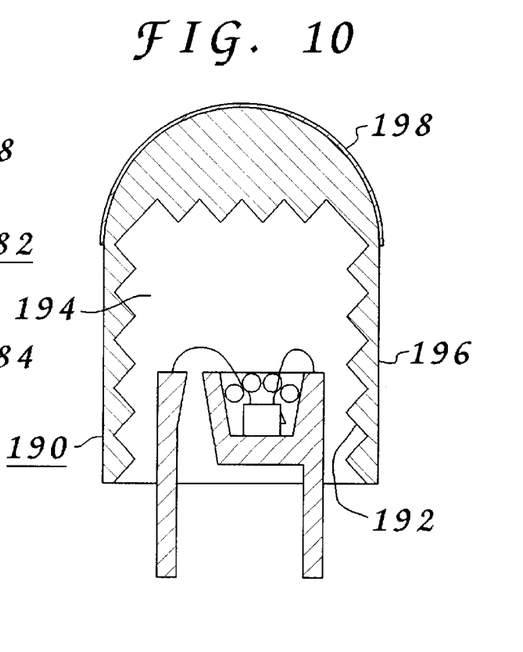
FIG. 10 is a sectional view of one embodiment of surface faceting on a protective cover.

FIG. 10 depicts a protective cover 190 which is translucent and which has an interior surface faceting 192 which acts to diffuse and scatter light passing through protective cover 190. Only the sectional edges of protective cover 190 are depicted with interior surface faceting 192 but in practice such interior surface faceting would extend throughout an interior 194 of protective cover 190, (not shown). Such faceting may be applied to an exterior 196 of protective cover 190 if desired. Such faceting (interior or exterior) may take many forms and patterns. Protective cover 190 also has a reflective coating 198 applied to a portion of exterior 196 to reflect light where light may only escape protective cover 190 at desired locations thereon.

Figure 13:
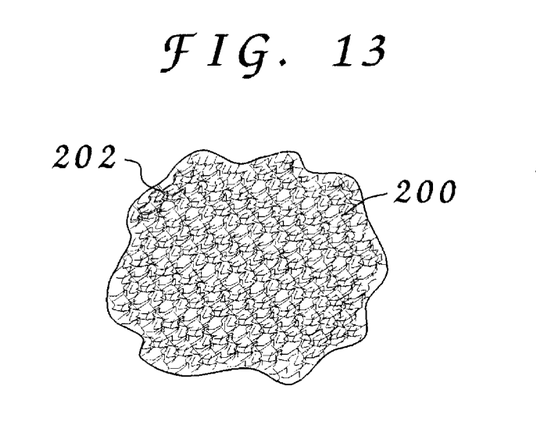
FIG. 13 is a cutaway view of a representation of a surface texturing of a protective cover.

FIG. 13 depicts one example of a surface texturing 200 on a small portion of a diffuser unit 202. When diffuser unit 202 is transparent or translucent such surface texturing 200 diffuses and scatters light passing through diffuser unit 202. When diffuser unit 202 is reflective such surface texturing 200 diffuse and scatters light reflected by diffuser unit 202.

Figure 14:
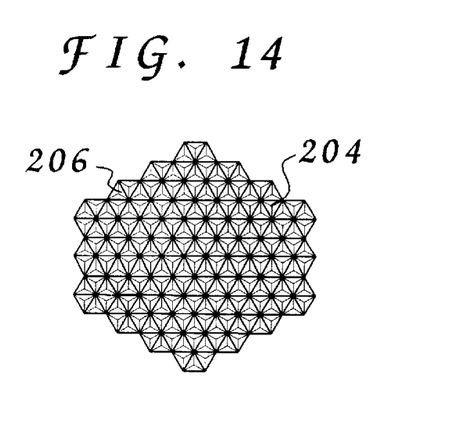
FIG. 14 is a cutaway view of a representation of a surface faceting of a protective cover.

FIG. 14 depicts one example of a surface faceting 204 on a small portion of a diffuser unit 206. When diffuser unit 206 is transparent or translucent such surface faceting 204 diffuses and scatters light passing through diffuser unit 206. When diffuser unit 206 is reflective such surface faceting 204 diffuse and scatters light reflected by diffuser unit 206.

FIG. 16 depicts a light source 208 positioned within a base 210. Light source 208 has a light emitting diode 212 having a protective cover 214 penetrating a reflector base 216. The interior of reflector base 216 is reflective to scatter light produced by light emitting diode 212. A diffuser unit 218 covers and closes reflector base 216. Diffuser unit 218 is transparent and has diffusion properties. A mirror, not shown, is mounted inside of diffuser unit 218 to prevent escape of light from a corresponding portion of diffuser unit 218 and to reflect light to other portions of diffuser unit 218 or back to reflector base 216. As shown in FIG. 16 it is not always necessary to provide a protective enclosure for the light source when mounted in a base to form a lamp assembly.

Figure 17A:
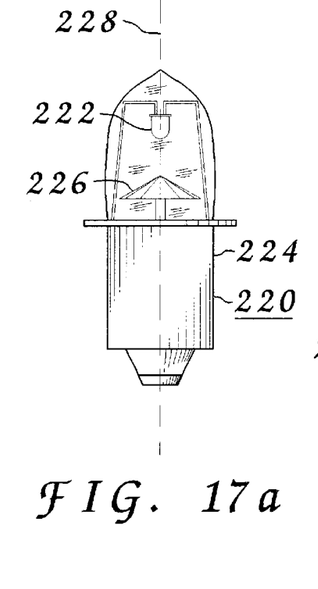
FIG. 17a is an elevational side view of a lamp assembly.

FIG. 17a depicts a lamp assembly 220 having a light emitting diode 222 facing back toward a base 224. A segmented reflector 226, also see FIG. 17b, is positioned in the path of light produced by light emitting diode 222 for dispersion thereof away from a central axis 228.

FIG. 18 depicts a lamp assembly 230 having a light emitting diode 232 positioned therein. A textured reflector diffuser 234, which is convex shaped, is positioned in the path of light produced by light emitting diode 232. Textured reflector diffuser 234 has a diffusion surface 236 which is rough and reflective and which reflects light in a random pattern for wide distribution thereof away from a central axis 238.

FIG. 19 depicts a lamp assembly 240 having a light emitting diode 242 positioned therein. A lens element 244 is depicted attached to a protective cover 246 of light emitting diode 242. Lens element 244 has a concave depression 248 positioned distal from light emitting diode 242. Lens element 244 has a receiving side 250 and a dispersing side 252 which is radially disposed. Lens element 244 acts to redirect the light produced by light emitting diode 242.

FIG. 20a and FIG. 20b depict light source 148 having five (5) light emitting diodes 150 (only three (3) shown) mounted within a respective reflector base 152. Each light emitting diode 150 faces in a unique direction to project light in a unique direction. In this instance each reflector base 152 acts as a diffuser unit to widen the angle of projection of light produced by the respective light emitting diode 150.

FIG. 23, FIG. 24a and FIG. 24b depict a reflector 254 positioned within transparent protective cover 168 above light emitting diode strip 170. Reflector 254 has a polished surface 256 which reflects light impacting thereon. This diffusion means provides for a dispersion of upwardly projected light produced by light emitting diode strip 170 radially outward from central axis 164 more so than that dispersion available in the absence of the diffusion means.

Light Emitting Diode Reflector

A small reflector many be employed to act to direct the light produced for additional diffusion where the light emitting diode chip, or chips, is mounted within the small reflector. In one embodiment a plurality of light emitting diode chips are mounted within the small reflector in a radially disposed array with each of the respective light producing surfaces aligned to project the light onto a reflective surface of the small reflector. Following reflection from the reflective surface of the small reflector the light ideally will pass through a diffuser unit where the light if further diffused to widen the angle of projection. In another embodiment a secondary reflector is positioned in the path of the light above the light emitting diode chip to reflect the produced light back to the small reflector for subsequent reflection therefrom, preferably to a diffuser unit. In a preferred embodiment the secondary reflector will be mounted directly to the diffuser unit.

FIG. 2b and FIG. 2c depict reflector base 126 having light emitting diodes 74 positioned therein. Reflector base 126 may be used alone to project light at a wide angle of projection or, as depicted in these views, be used to direct light to diffuser unit 178 for further dispersion thereby. FIG. 2b and FIG. 2c depict use of a plurality of light emitting diodes with a light emitting diode reflector.

FIG. 16 depicts reflector base 216 having a reflective surface therein, not shown, capable of redirecting light to diffuser unit 218. FIG. 16 depicts use of a single light emitting diode with a light emitting diode reflector.

FIG. 20a and FIG. 20b depict five (5) light emitting diode reflectors 152 each having one (1) light emitting diode 150 positioned therein. When wide angle light emitting diodes are employed some light from light emitting diodes 150 strikes a reflective surface 258 of the respective light emitting diode reflector 152 and is further dispersed to an even wide angle of projection. Light source 148, as is true for all light sources of the present invention, may be mounted within a base to form a lamp assembly or may be directly installed within a collimating reflector type flashlight. FIG. 20a and FIG. 20b depict use of a single light emitting diode with a light emitting diode reflector wherein the reflector widens the angle of projection of the produced light.

Light Color Characteristics

It is a strong desire to produce a beam of light from the flashlight wherein the light visibly appears to be white light. This may be accomplished by utilizing light emitting diode chips which initially produce blue light and which have a yellow phosphor coating which act to convert the blue light to appear white, as conventionally known in the art. The shortcoming of this arrangement involves the higher production cost of such white light producing light emitting diode chips over those which lack the phosphor coating and a lack of uniformity of color in the produced light.

When viewing a circular projection of light produced by a conventional white light emitting diode on a surface an observer will normally notice a blue tint which sometimes manifests itself as a ring of blueish hue in the projected circle of light. The observed blue tint is a bleed through of color from the original produced light from the white light emitting diode. A white light emitting diode chip is manufactured by taking a completed blue light emitting diode chip and applying an overcoating of yellow phosphor. Phosphor is a composition of matter which radiates light upon impact of light of a different wave length. When the blue produced light passes through and interacts with the yellow phosphor a spectral shift occurs into the white color spectrum. The emitted light is white, but not pure white.

The use of color mixing using one of the principles of the present invention diffuses the colors, thereby mixing them to appear as pure white light without the blue tint associated with the bleed through of conventional white light emitting diode chips. By using a diffuser unit to mix the colors a truer white light is produced.

One embodiment which your applicant has developed to produce white light involves the use of multiple inexpensive light emitting diode chips having different color characteristics and mixing these colors to produce the desired white light. Experimentation has determined that use of four (4) light emitting diode chips of generally equal lumens, with two (2) of these chips producing blue light, one (1) of these chips producing green light and one (1) of these chips producing red light, produces a visibly acceptable white light when properly mixed. Various methods may be employed to mix the different colored light. The small reflector mounting of the four light emitting diode chips described elsewhere herein in combination with closure of the small reflector with a diffuser unit is ideally suited to this color mixing.

Another embodiment which your applicant has developed to produce white light involves a fuller mixing of the light produced by conventional white light emitting diodes to eliminate, or significantly reduce, the visible appearance of blue light.

Yet another embodiment which your applicant has developed to produce visibly acceptable white light involves the use of a conventional blue light emitting diode chip and doping, or coating, the blue light emitting diode chip with a phosphor mixture having red phosphor and green phosphor and blue phosphor. This differs from the conventional doping or coating method for blue light emitting diode chips which utilizes a yellow phosphor in an attempt to produce while light. The mixture of red, green and blue phosphors offers an alternate method of producing a white light emitting diode chip.

Referring now to the state of the art, FIG. 8 depicts a conventional method of converting blue light to while light. Blue light emitting diode 118 produces light having a blue color. This blue light passes through phosphor 124 having a yellow color. This interaction with the yellow phosphor 124 causes the blue light to be altered to appear as white light.

Referring now to the present invention, FIG. 2b and FIG. 2c depict four (4) light emitting diodes 74. As shown in FIG. 2c there are two (2) blue light emitting diodes 260, one (1) green light emitting diode 262 and one (1) red light emitting diode 264. When these three (3) colors (blue, green and red) are mixed in the proportions represented and properly mixed together as occurs as a result of cooperation between reflector base 126, diffuser unit 178 and reflective coating 180, a white light is produced by light source 66.

Figure 11:
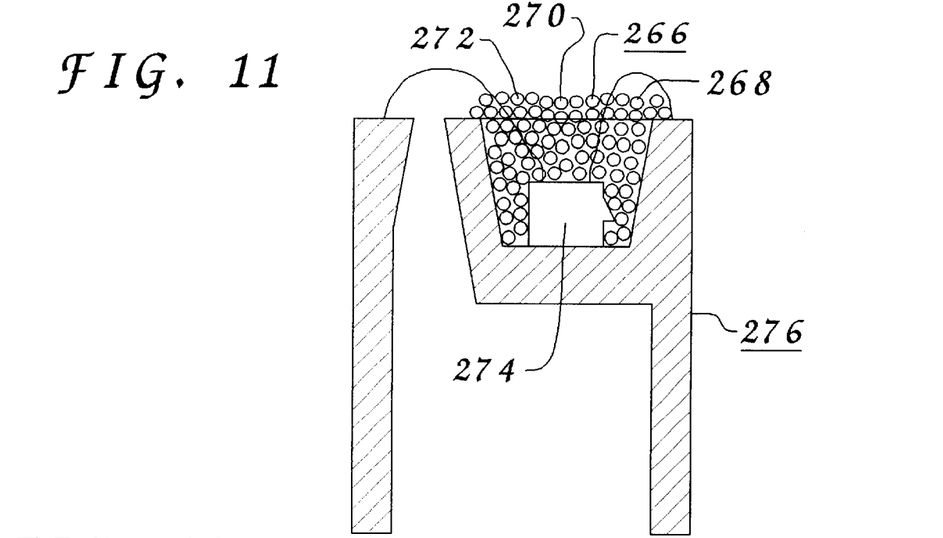
FIG. 11 is a sectional view of a wide angle light emitting diode with a multi color phosphor coating installed thereon.

FIG. 11 depicts a method of converting blue light to white light using a method of the present invention. A phosphor mix 266, having red phosphor 268 and green phosphor 270 and blue phosphor 272, is used to coat a blue light emitting diode chip 274 of a blue light emitting diode 276. When blue light is produced by blue light emitting diode chip 274, and that light passes through and interacts with phosphor mix 266, white light is produced.

With respect to the above description then, it is to be realized that the optimum dimensional relationships for the parts of the invention, to include variations in size, material, shape, form, function and manner of operation, assembly and use, are deemed readily apparent and obvious to one skilled in the art, and all equivalent relationships to those illustrated in the drawings and described in the specification are intended to be encompassed by the present invention.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

I claim:

1. A lamp assembly for a portable hand-held flashlight, the portable hand-held flashlight having a mount for the lamp assembly, a battery power supply, a first power transfer connector, a second power transfer connector and a switch, the switch having an active position and an inactive position, the lamp assembly comprising:
    a) a base having:
        1) an exterior;
        2) an interior;
        3) a first electrical connector positioned on the exterior, the first electrical connector to provide for a subsequent connection to the first power transfer connector of the portable hand-held flashlight;
        4) a second electrical connector positioned on the exterior, the second electrical connector to provide for a subsequent connection to the second power transfer connector of the portable hand-held flashlight;
        5) insulating means to provide for insulating the first electrical connector from the second electrical connector;
        6) coupling means to provide for a mounting of the lamp assembly at the base of the lamp assembly to the mount of the portable hand-held flashlight;
    b) a light emitting diode assembly positioned relative to the interior of the base, the light emitting diode assembly having:
        1) a first power coupling to provide for a transfer of power from the first electrical connector of the base;
        2) a second power coupling to provide for a transfer of power to the second electrical connector of the base;
        3) a light producing surface to provide for a production of a light when the switch of the portable hand-held flashlight is in the active position in response to power moving between the first power coupling and the second power coupling, the light produced having a path of projection from the light producing surface;
    c) a diffuser unit to provide for a dispersion of at least a portion of the light produced by the light producing surface from the path of projection to a generally wide angle of dispersion.

2. The lamp assembly defined in claim 1 wherein the portable hand-held flashlight further comprises a collimating reflector and wherein at least a portion of the light dispersed by the diffuser unit to the generally wide angle of dispersion is reflected by the collimating reflector of the portable hand-held flashlight into a beam of light.

3. The lamp assembly defined in claim 2 further comprising a reflector positioned in close proximity to the light emitting diode assembly and on an opposing side of the light emitting diode assembly from the diffuser unit, the reflector to provide for a further dispersion of the light produced by the light producing surface of the light emitting diode assembly.

4. The lamp assembly defined in claim 1 further comprising at least one additional light emitting diode assembly.

5. The lamp assembly defined in claim 1 wherein the diffuser unit further comprises a multiplicity of surface facets.

6. The lamp assembly defined in claim 1 wherein the diffuser unit further comprises a textured surface.

7. The lamp assembly defined in claim 1 wherein the light emitting diode assembly further comprises a bowl reflector and a diffusing coating, the bowl reflector having a cavity and at least one reflective wall, the cavity having a centered axis therethrough, the reflective wall surrounding the cavity and angularly offset relative to centered axis of the cavity, the reflective wall having an upper extent and wherein the light producing surface is positioned within the cavity below the upper extent of the reflective wall, the diffusing coating covering the light producing surface wherein the light produced by the light producing surface interacts with the diffusing coating during passage therethrough where a portion of the light strikes the reflective wall of the bowl reflector and is further diffused to broaden the path of projection of the light.

8. A lamp assembly for a portable hand-held flashlight, the portable hand-held flashlight having a mount for a conventional incandescent lamp, a battery power supply, a first power transfer connector, a second power transfer connector and a switch, the switch having an active position and an inactive position, the conventional incandescent lamp having a filament, the mount for the conventional incandescent lamp placing the filament of the conventional incandescent lamp at a relative elevated position relative to the mount, the replacement lamp assembly comprising:
    a) a base having:
        1) an exterior;
        2) an interior;
        3) a first electrical connector positioned on the exterior, the first electrical connector to provide for a subsequent connection to the first power transfer connector of the portable hand-held flashlight;
        4) a second electrical connector positioned on the exterior, the second electrical connector to provide for a subsequent connection to the second power transfer connector of the portable hand-held flashlight;
        5) insulating means to provide for insulating the first electrical connector from the second electrical connector;
        6) coupling means to provide for a mounting of the lamp assembly at the base of the lamp assembly to the mount of the portable hand-held flashlight;

b) a light emitting diode assembly having:
1) a first power coupling to provide for a transfer of power from the first electrical connector of the base;
2) a second power coupling to provide for a transfer of power to the second electrical connector of the base;
3) a light producing surface to provide for a production of a light when the switch of the portable hand-held flashlight is in the active position in response to power moving between the first power coupling and the second power coupling, the lamp assembly having a light dispersion location subsequent to production of the light;

c) placement means to provide for positioning the light dispersion location of the lamp assembly within the interior of the base at a respective relative elevated position relative to the mount of the portable hand-held flashlight which generally matches a position of the relative elevated position of the filament of the conventional incandescent lamp relative to the mount when the conventional incandescent lamp is positioned within the mount of the portable hand-held flashlight;

d) protective means to provide for protecting at least a portion of the light emitting diode assembly.

9. The lamp assembly defined in claim 8 further comprising a plurality of light emitting diode assemblies and wherein the plurality of light emitting diode assemblies cooperate to produce the light dispersion location.

10. The lamp assembly defined in claim 9 wherein the protective means further comprises a protective cover and wherein the protective cover covers the plurality of light emitting diode assemblies and wherein the protective cover further comprises diffusion means to provide for a dispersion of the light produced by the plurality of light emitting diode assemblies.

11. The lamp assembly defined in claim 8 wherein the protective means further comprises diffusion means to provide for a dispersion of the light produced by the light emitting diode assembly.

12. The lamp assembly defined in claim 8 further comprising a reflector positioned in close proximity to the light emitting diode assembly, the reflector to provide for a reflection of at least a portion of the light produced by the light producing surface of the light emitting diode assembly, the reflection to change a directional orientation of the reflected light.

13. The lamp assembly defined in claim 8 wherein the light emitting diode assembly further comprises a bowl reflector and a diffusing coating, the bowl reflector having a cavity and at least one reflective wall, the cavity having a centered axis therethrough, the reflective wall surrounding the cavity and angularly offset relative to centered axis of the cavity, the reflective wall having an upper extent and wherein the light producing surface is positioned within the cavity below the upper extent of the reflective wall, the diffusing coating covering the light producing surface wherein the light produced by the light producing surface interacts with the diffusing coating during passage therethrough where a portion of the light strikes the reflective wall of the bowl reflector and is further diffused to broaden the path of projection of the light.

* * * * *